(12) United States Patent
Zemen et al.

(10) Patent No.: US 6,562,549 B2
(45) Date of Patent: May 13, 2003

(54) METHOD OF MANUFACTURING PHOTOMASKS BY PLASMA ETCHING WITH RESIST STRIPPED

(75) Inventors: Rick Zemen, Austin, TX (US); Tiecheng Zhou, Austin, TX (US)

(73) Assignee: Photronics, Inc., Brookfield, CT (US)

( * ) Notice: Subject to any disclaimer, the term of this patent is extended or adjusted under 35 U.S.C. 154(b) by 0 days.

(21) Appl. No.: 10/136,251

(22) Filed: Apr. 29, 2002

(65) Prior Publication Data

US 2002/0119380 A1 Aug. 29, 2002

Related U.S. Application Data

(63) Continuation of application No. 09/283,087, filed on Mar. 31, 1999, now Pat. No. 6,406,818.

(51) Int. Cl.[7] .............................. G03C 5/00; G03F 9/00
(52) U.S. Cl. ..................... 430/316; 430/5; 430/318; 430/323; 430/325
(58) Field of Search ................. 430/5, 22, 30, 430/313, 316, 318, 323, 325; 216/58, 59, 67, 71, 72, 74, 75, 76; 438/710, 722, 738

(56) References Cited

U.S. PATENT DOCUMENTS

| | | |
|---|---|---|
| 3,900,737 A | 8/1975 | Collier et al. |
| 4,411,972 A | 10/1983 | Narken et al. |
| 4,530,891 A | 7/1985 | Nagarekawa et al. |
| 4,556,608 A | 12/1985 | Kaneki et al. |
| 4,657,648 A | 4/1987 | Nagarekawa et al. |
| 5,773,199 A | 6/1998 | Linliu et al. |
| 5,795,688 A | 8/1998 | Burdorf et al. |
| 5,840,200 A | 11/1998 | Nakagawa et al. |
| 5,939,227 A | 8/1999 | Smith |
| 5,948,570 A | 9/1999 | Kornblit et al. |
| 5,955,222 A | 9/1999 | Hibbs et al. |
| 6,016,357 A | 1/2000 | Neary et al. |
| 6,406,818 B1 * | 6/2002 | Zemen et al. .................. 430/5 |

* cited by examiner

*Primary Examiner*—Mark F. Huff
*Assistant Examiner*—Saleha R. Mohamedulla
(74) *Attorney, Agent, or Firm*—Amster, Rothstein & Ebenstein

(57) ABSTRACT

A method for adjusting out of tolerance critical dimensions of an under processed photomask to be within predetermined defined limits after the photosensistive resist material has been removed from the exposed photomask. The method includes measuring the critical dimensions of the opaque material of the under processed photomask after the photosensitive resist material has been removed, and exposing the photomask to electrified plasma gases for removing excess opaque material without degrading the reflectivity of the photomask beyond specified limits.

31 Claims, 2 Drawing Sheets

METHOD OF MANUFACTURING PHOTOMASKS BY PLASMA ETCHING WITH RESIST STRIPPED

CROSS-REFERENCE TO RELATED APPLICATION

This patent application is a continuation of co-pending U.S. application Ser. No. 09/283,087, filed Mar. 31, 1999, now U.S. Pat. No. 6,406,818, and entitled "IMPROVED METHOD OF MANUFACTURING PHOTOMASKS BY PLASMA ETCHING WITH RESIST STRIPPED", the contents of which are incorporated herein by reference in their entirety.

BACKGROUND OF INVENTION

Photomasks are used in the semiconductor industry to transfer microscale images defining a semiconductor circuit onto a silicon or gallium arsenide substrate or wafer. Generally, a photomask is comprised of a transparent substrate and an opaque material. More specifically, a typical binary photomask is comprised of a quartz substrate and chrome opaque material that includes an integral layer of chrome oxide anti-reflective material (AR). The pattern of the chrome opaque material and chrome oxide AR material on the quartz substrate is a scaled negative of the image desired to be formed on the semiconductor wafer.

To create an image on a semiconductor wafer, a photomask is interposed between the semiconductor wafer which includes a layer of photosensitive material and an energy source commonly referred to as a Stepper. The energy generated by the Stepper passes through the portions of the quartz substrate of the photomask not covered by the chrome opaque material and the chrome oxide AR material and causes a reaction in the photosensitive material on the semiconductor wafer. Accordingly, energy from the Stepper is inhibited from passing through the areas of the photomask in which the chrome opaque material and chrome oxide AR is present. The chrome oxide AR material prevents most of the incident energy from being reflected back into the Stepper. If excess energy is reflected back into the Stepper a degraded image will be created in the photosensitive resist material on the semiconductor wafer surface, thereby resulting in a degradation of performance of the semiconductor device.

A finished photomask used in the production of semiconductor devices is formed from a "blank" photomask. As shown in FIG. 1, a blank photomask is comprised of four layers. The first layer 2 is a layer of quartz, commonly referred to as the substrate, is typically approximately one quarter inch thick. Affixed to the quartz substrate 2 is a layer of chrome opaque material 4 which typically is approximately 900 angstroms thick. An integral layer of chrome oxide anti-reflective material (AR) 6 is formed on top of the layer of chrome opaque material 4. The third layer of chrome oxide AR material is typically approximately 100 angstroms thick. A layer of photosensitive resist material 8 resides on top of the chrome oxide AR material 6. The photosensitive resist material 8 is typically a hydrocarbon, the actual composition and thickness of which is well known in the art.

The desired pattern of chrome opaque material to be created on the photomask may be defined by an electronic data file loaded into an exposure system which typically scans an electron beam (E-beam) or laser beam in a raster fashion across the blank photomask. One such example of a raster scan exposure system is described in U.S. Pat. No. 3,900,737 to Collier. As the E-beam or laser beam is scanned across the blank photomask, the exposure system directs the E-beam or laser beam at addressable locations on the photomask as defined by the electronic data file. The portions of the photosensitive resist material that are exposed to the E-beam or laser beam become soluble while the unexposed portions remain insoluble. As shown in FIG. 2, after the exposure system has scanned the desired image unto the photosensitive resist material, the soluble photosensitive resist is removed by means well known in the art, and the unexposed, insoluble photosensitive resist material 10 remains adhered to the AR material 6.

As illustrated in FIG. 3, the exposed chrome oxide AR material and the underlying chrome opaque material which is no longer covered by the photosensitive resist material is removed by an "etching" process such that only the portions of chrome AR material 12 and chrome opaque material 14 corresponding to the remaining photosensitive resist material 10 remain on quartz substrate 2. This initial or base etching may be accomplished by either a wet-etching or dry-etching process both of which are well known in the art. In general, wet-etching process uses a liquid acid solution to eat away the exposed AR and chrome. A dry-etching process, also referred to as plasma etching, utilizes electrified gases, typically a mixture of chlorine and oxygen, to remove the exposed chrome oxide AR material and chrome opaque material.

A dry etching process is partially anisotropic or directional in nature, rather than the isotropic wet-etching process typically used in the base etching step of photomask manufacture. As shown in FIG. 4, the dry-etching process is conducted in vacuum chamber 20 in which gases, typically chlorine and oxygen, 22 are injected. Also included in vacuum chamber 20 is anode 24 and cathode 26. The electrical field created between anode 24 and cathode 26 form a reactive gas plasma 30 from the injected chlorine and oxygen gases 22. Positive ions of the reactive gas plasma 30 are accelerated toward photomask 28, which is at the same potential as cathode 26, and which is oriented such that the surface area of quartz substrate 2 is perpendicular to the electrical field. The directional ion bombardment enhances the etch rate of the chrome opaque material and chrome oxide AR material in the vertical direction 32 but not in the horizontal direction (i.e., the etching is partially anisotropic or directional).

The reaction between the reactive gas plasma 30 and the chrome opaque material and chrome oxide AR material is a two step process. First, a reaction between the chlorine gas and exposed chrome oxide AR material and chrome opaque material forms chrome radical species. The oxygen then reacts with the chrome radical species to create a volatile which can "boil off" thereby removing the exposed chrome oxide AR material and the exposed chrome opaque material. When dry-etching is used for the initial or base etching of the photomask, the hydrocarbon photosensitive resist material can react with the oxygen in the plasma gases limiting the amount of oxygen that can be injected into chamber 20 and used to form the reactive plasma gas 30. Accordingly, in the prior art the amount of gases injected into the vacuum chamber is typically 75 percent chlorine and 25 percent oxygen by volume.

As shown in FIG. 5, after the etching process is complete the remaining unexposed photosensitive resist material is subsequently removed or stripped, using a method well known in the art, leaving a pattern of exposed chrome oxide AR material 12 and chrome opaque material 14 remaining on the quartz substrate 2 conforming to the image initially defined in the electronic data file loaded into the exposure system.

The dimensions of the chrome opaque material on the finished photomask are then measured to determine whether or not critical dimensions are within specified tolerances. Those skilled in the art will appreciate that the critical dimensions of a finished photomask can be more accurately measured after the photosensitive material has been stripped away since the presence of the photosensitive resist material interferes with the taking of accurate critical dimensions measurements. Critical dimensions may be measured at a number of locations on the finished photomask, summed, and then divided by the number of measurements to obtain a numerical average of the critical dimensions. This obtained average is then compared to a specified target number (i.e., a mean to target comparison) to ensure compliance with the predefined critical dimensions specifications. Additionally, it is desired that there be a small variance among the critical dimensions on the substrate. Accordingly, the measured critical dimensions typically must also conform to a specified uniformity requirement.

As shown in FIG. 5, measured critical dimensions may fall outside of required limits because excess chrome opaque material 16 remains on the substrate (i.e., the photomask is under processed). Additionally, CDs may fall outside required limits because too much chrome material has been removed (i.e., the photomask is over processed). If the critical dimensions of a finished photomask are outside the specified tolerances because the finished photomask has been over processed, the finished photomask is rejected and as it cannot be modified to bring it within specified tolerances. Likewise, if the critical dimensions of a finished photomask are outside of specified tolerances because the photomask is under processed, the photomask cannot be re-etched by the methods known in the art because the photosensitive resist material as been removed. Accordingly, if the critical dimensions of a finished photomask after having its photosensitive resist material stripped are not within the specified tolerances (i.e., the photomask is either over processed or under processed) the photomask is "rejected", resulting in a negative cost and schedule impact.

SUMMARY OF INVENTION

Accordingly, it is the object of the present invention to provide a method for re-etching photomasks thereby improving the yield of photomasks (i.e., reducing the percentage of rejected photomasks) by allowing the critical dimensions of under processed photomasks to be modified after the layer of photosensitive resist material has been removed.

It is a further object of the present invention to provide a method for re-etching under processed photomasks after the photosensitive resist material has been removed so that all critical dimensions are adjusted uniformly.

It will be appreciated by those skilled in the art that FIGS. 1 through 5 are for illustrative purposes and therefore are not per scale.

DETAILED DESCRIPTION OF THE INVENTION

The process for re-etching photomasks after the photosensitive material has been stripped in accordance with the instant invention is directed to under processed photomasks (i.e., those photomasks having excess chrome opaque material). The re-etching process of the instant invention utilizes a modified dry, or plasma etching process to remove the excess chrome opaque material of the under processed photomask after the photosensitive resist material has been removed and critical dimensions accurately measured.

Figure 1:
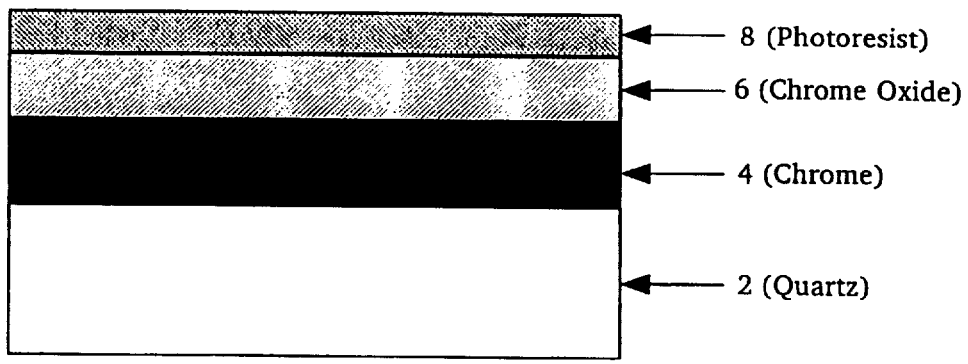
FIG. 1 is a cross-sectional view of a blank photomask illustrating the composition and thickness of the various layers of a typical blank binary photomask.
Figure 2:
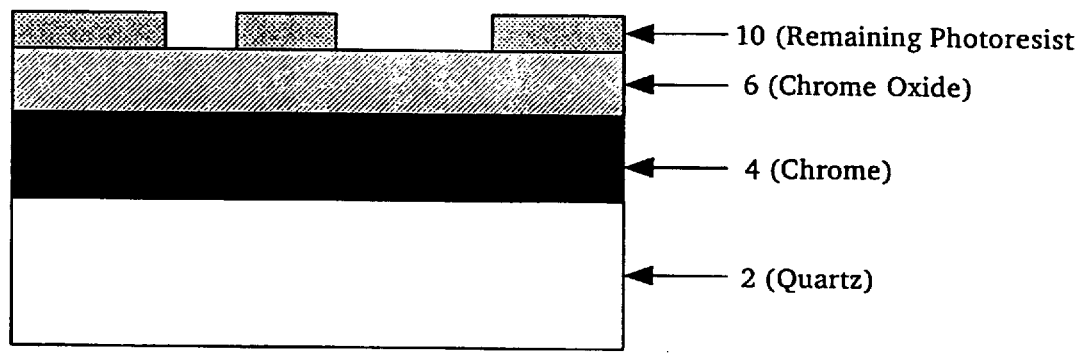
FIG. 2 is a cross-sectional view of a blank photomask after exposure to an energy source and having the soluble photosensitive material stripped away.

It has been observed by the inventors of the instant invention that the amount of chrome oxide forming the AR layer of a blank photomask, as shown for example in FIG. 1, is generally in excess of the amount required to keep the amount of incident light that is reflected back to the Stepper within specified limits. More specifically, blank photomasks such as shown in FIG. 1 usually are produced with an amount of chrome oxide AR material 6 such that only 11 percent of incident energy is reflected back to the Stepper. However, Steppers can typically accommodate as much as 16 percent of incident energy without the reflected light negatively impacting the image formed on the semiconductor wafer.

Accordingly, the method of the present invention takes advantage of the leeways in the tolerances of the blank photomasks and Stepper systems to allow for the re-etching of finished photomasks after the photosensitive material has been stripped. More specifically, the method of the instant invention sacrifices a small percentage of the chrome oxide AR material 6 and thus increases the amount of reflected incident light but not so much as to exceed the specified limit of reflectivity, allowing the photomask to be successfully used in a stepper to create an image on a semiconductor wafer.

Figure 3:
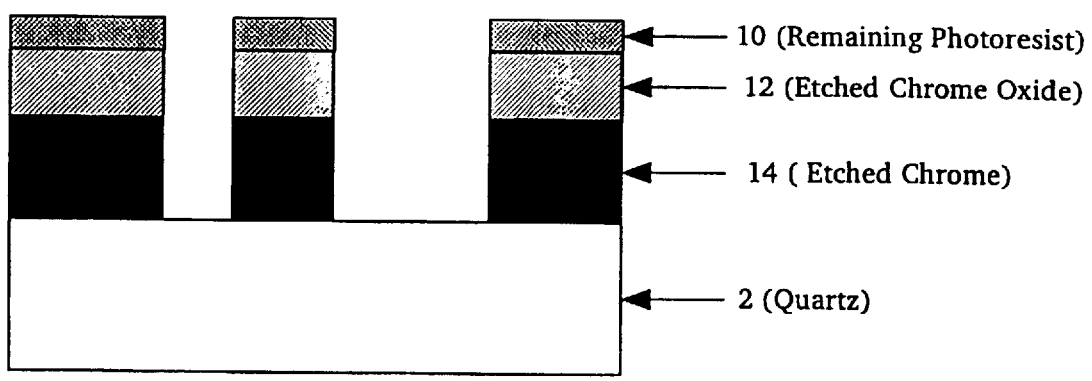
FIG. 3 is a cross-sectional view of a photomask after being subjected to an etching process for removing the exposed chrome oxide AR material and chrome opaque material.
Figure 5:
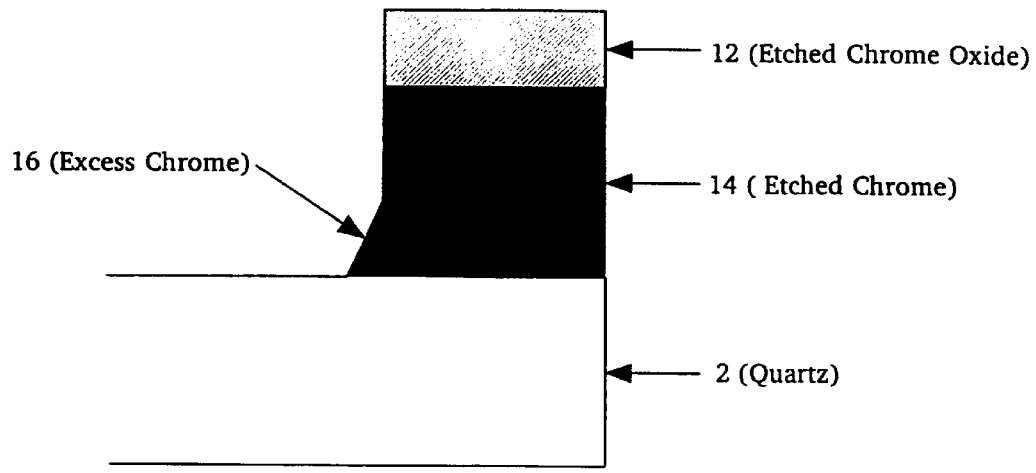
FIG. 5 is a cross-sectional view of an under processed finished photomask.
Figure 4:
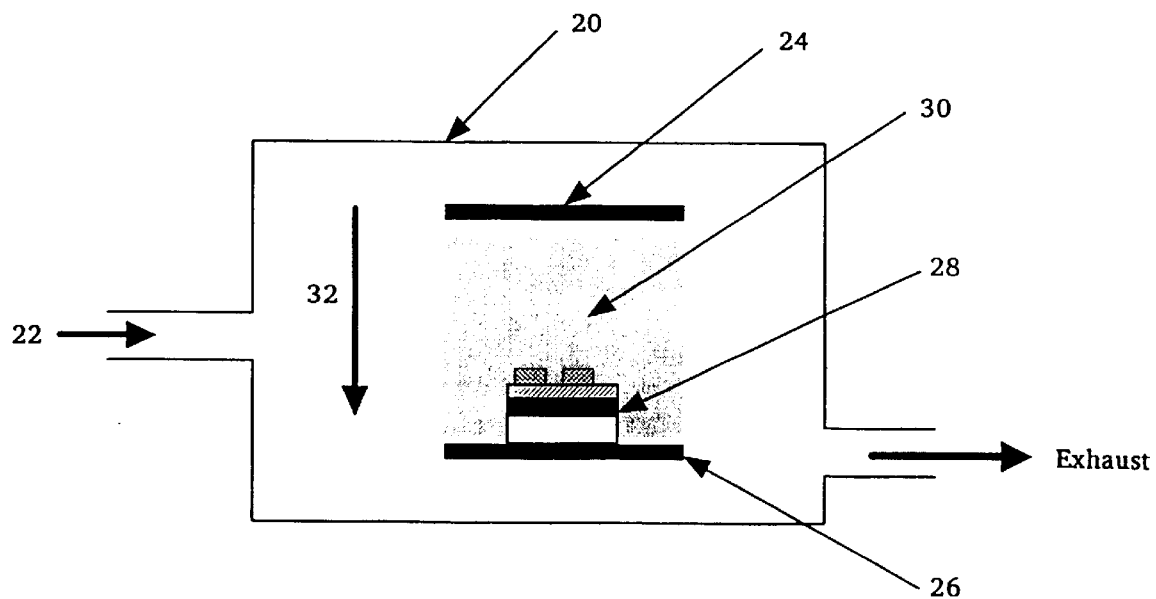
FIG. 4 illustrates a typical dry or plasma etching apparatus that may be used to perform the instant invention.

The re-etching of the finished photomasks with the photosensitive resist material removed of the instant invention utilizes a dry or plasma etching process. However, unlike the base plasma etching process described above, the photomask being re-etched does not include photosensitive resist material 10 as shown in FIG. 3 to protect the chrome oxide AR material 12 and the chrome opaque material 14 from the reactive plasma gases. Accordingly, the ratio of the chlorine and oxygen gases used to form the reactive plasma gas can be adjusted to increase the etch rate of the chrome opaque material while decreasing the etch rate of the chrome oxide AR material.

More specifically, the dry-etching process used to re-etch the finished photomasks is conducted in a vacuum chamber in which chlorine and oxygen gases are injected. Included in vacuum chamber are an anode and a cathode which form an electric field thereby creating a reactive gas plasma from the injected chlorine and oxygen gases. Positive ions of the plasma gas are accelerated toward the finished photomask which is oriented perpendicular to the electrical field and is at the same potential as the cathode.

The reaction between the reactive plasma gases and the excess chrome opaque material (i.e., 16 of FIG. 5) is a two step process. First, a reaction between the chlorine gas and exposed chrome oxide AR material and chrome opaque material forms chrome radical species. The oxygen then reacts with the chrome radical species to create a volatile which can "boil off" thereby removing the exposed chrome oxide AR material and the exposed chrome opaque material. However, as the excess chrome opaque material is being "boiled off" there is also a loss of chrome oxide AR material 12 which is also exposed to the plasma etching gases. Thus, as the excess chrome opaque material 16 is removed by the re-etching process so is the chrome oxide AR material 12, thereby limiting the amount to which the critical dimensions of the under processed photomask may be changed sufficiently to bring it within specified tolerances.

Accordingly, in the preferred embodiment of the present invention, the ratio of the chlorine and oxygen gases used to form the reacting plasma gases have been selected such that the relative etch rate of the excess chrome opaque material 16 is increased with respect to the etch rate of the chrome oxide AR material 12. More specifically, the inventors have found that by increasing the amount of oxygen used in the plasma etching process, the etch rate of the excess chrome opaque material 16 can be increased while the etch rate of the chrome oxide AR material 12 can be decreased.

In the preferred embodiment of the present invention, the ratio of chlorine to oxygen gas injected into the vacuum chamber is approximately 15 percent to 85 percent by volume. By increasing the amount of oxygen in the re-etching process, the etch rate of the chrome oxide AR material is decreased while the etch rate of the chrome opaque material is increased thereby allowing greater correction of out of tolerance critical dimensions. It will be appreciated by those skilled in the art that the amount of oxygen used in the re-etching process is not limited by the reaction of the photosensitive resist material, as is the case in the prior art plasma etching process described above, since the photosensitive resist material has been removed prior to the re-etching process. It has been found that a 90 second exposure to the 85 percent oxygen to 15 percent chlorine reactive gas plasma can result in an approximately 30 nanometer correction to out of tolerance critical dimensions without reducing the thickness of chrome oxide AR material 12 to a degree in which more than 16 percent of incident energy would be reflected back to the Stepper. In practice, the inventors have found that due to the variances in the amount of chrome oxide AR material 12 provided on the blank photomasks, it is advantageous to subject the out of tolerance finished photomask to a series of short exposures (e.g., 30 seconds) to the reactive gas plasma to effect approximately 10 nanometer change in critical dimensions. After each exposure the previously identified out of tolerance critical dimension, or dimensions, are checked to determine if they have been brought within the specified tolerances. If all the critical dimensions are within specified ranges, the photomask is not subjected to any additional exposure to the reactive gas plasma that may reduce the amount of chrome oxide AR material 12 below specified limits. If out of tolerance critical dimensions remain outside the specified ranges, the photomask is subject to additional exposures to the reactive gas plasma.

Although the re-etching of out of tolerance photomasks has been described above with respect to a reactive gas plasma composition of 15 percent chlorine to 85 percent oxygen by volume which increases the effective etching rate of the excess chrome opaque material 16 to the chrome oxide AR material 12 thereby increasing the degree to which out of tolerance critical dimensions can be corrected, the re-etching may be accomplished with other ratios of chlorine to oxygen, as well as other gas combinations. However the degree to which out of tolerance critical dimensions can be corrected may be more limited. Various additional modifications and improvements thereon will become readily apparent to those skilled in the art. Those skilled in the art will appreciate that the re-etching process may be used on photomasks having opaque material other than chrome, anti-reflective material other than chrome oxide, and plasma gases other than chlorine and oxygen. Additionally, those skilled in the art will appreciate that the re-etching process may be used on photomasks which do not include a separate layer of anti-reflective material. For example, the re-etching process may be used with photomasks having molybdenum silicide (MoSi) opaque material and plasma gases of HCF and $CF_3$. Accordingly, the spirit and scope of the present invention is to be construed broadly and limited only by the appended claims, and not by the foregoing specification.

What is claimed is:

1. A method for manufacturing a semiconductor comprising the steps of:

interposing a finished photomask, having substantially transparent areas, between a semiconductor wafer and an energy source;

transmitting energy generated by said energy source through said substantially transparent areas of said finished photomask to said semiconductor wafer; and etching an image, corresponding to said substantially transparent areas of said finished photomask, on said semiconductor wafer, wherein said finished photomask is created from an under processed photomask by a process for removing excess portions of opaque material from said under processed photomask thereby adjusting out of tolerance critical dimensions to within predetermined limits, said under processed photomask comprising a substantially transparent substrate and selected areas of opaque material and anti-reflective material covered by resist material, said anti-reflective material having an initial thickness with a reflectivity value reflecting a first percentage of incident energy, and said process of removing excess portions comprising the steps of:

(a) removing said resist material;

(b) measuring at least one critical dimension of said opaque material;

(c) determining the amount of excess opaque material to be removed to bring said at least one critical dimension within predetermined limits; and (d) exposing said under processed photomask to electrified plasma gases for a period of time, said period of time corresponding to the desired amount of excess opaque material to be removed, said anti-reflective material after said exposure to electrified plasma gases having a second thickness with a reflectivity value reflecting a second percentage of incident energy less than a predetermined value that an imaging device can accommodate without adversely impacting its operation.

2. The method of claim 1, wherein said step of etching said image comprises the steps of removing photosensitive material from said semiconductor wafer and etching areas of said semiconductor wafer underlying said removed photosensitive material.

3. The method of claim 2, wherein the step of removing photosensitive material comprises removing photosensitive material exposed to said transmitted energy when positive photolithographic processes are used.

4. The method of claim 2, wherein the step of removing photosensitive material comprises removing photosensitive material not exposed to said transmitted energy when negative photolithographic processes are used.

5. The method of claim 1, wherein said opaque material is comprised of chrome and said anti-reflective material is comprised of chrome oxide.

6. The method of claim 5, wherein said electrified plasma gases are comprised of chlorine and oxygen.

7. The method of claim 6, wherein the ratio of said chlorine to said oxygen comprising said electrified plasma gases is chosen such that the etch rate of the chrome opaque material is increased with respect to the etch rate of the chrome oxide anti-reflective material.

8. The method of claim 7, wherein said ratio of said chlorine to said oxygen in said electrified plasma gases is 15 percent to 85 percent by volume.

9. A method for manufacturing a semiconductor comprising the steps of:
  interposing a finished photomask, having substantially transparent areas, between a semiconductor wafer and an energy source;
  transmitting energy generated by said energy source through said substantially transparent areas of said finished photomask to said semiconductor wafer; and
  etching an image, corresponding to said substantially transparent areas of said finished photomask, on said semiconductor wafer, wherein said finished photomask is manufactured by processing a blank photomask, said blank photomask comprising (1) a substantially transparent substrate, (2) a layer of opaque material covering substantially all of said substantially transparent substrate, (3) a layer of anti-reflective material covering substantially all of said layer of opaque material and having a first thickness reflecting a first percentage of incident energy less than a predetermined value, and (4) a layer of photoresist material covering substantially all of said layer of anti-reflective material, and said step of processing said blank photomask comprises the steps of:
  (a) creating a pattern of said photoresist material thereby exposing selected areas of said anti-reflective material layer;
  (b) etching said selected areas of said anti-reflective material layer and substantially all of said opaque material layer underlying said selected areas of said anti-reflective material layer, thereby creating a pattern of anti-reflective material and a pattern of said opaque material substantially corresponding to said pattern of said photoresist material;
  (c) removing said pattern of said photoresist material;
  (d) measuring at least one critical dimension of said pattern of opaque material and comparing said measured critical dimension to a predetermined value thereby determining the presence of excess opaque material; and
  (e) performing a second etching process thereby removing a first portion of said excess opaque material, said pattern of said anti-reflective material after said second etching process having a second thickness reflecting a second percentage of incident energy below a predetermined value that an imaging device can accommodate without adversely impacting its operations.

10. The method of claim 9, wherein said step of etching said image comprises the steps of removing photosensitive material from said semiconductor wafer and etching areas of said semiconductor wafer underlying said removed photosensitive material.

11. The method of claim 10, wherein the step of removing photosensitive material comprises removing photosensitive material exposed to said transmitted energy when positive photolithographic processes are used.

12. The method of claim 10, wherein the step of removing photosensitive material comprises removing photosensitive material not exposed to said transmitted energy when negative photolithographic processes are used.

13. The method of claim 9, wherein said second etching process comprises exposing said substantially transparent substrate, said pattern of anti-reflective material, and said excess opaque material to electrified plasma gases for a period of time corresponding to said first portion of said excess opaque material to be removed.

14. The method of claim 13, wherein said process of creating finished photomask further comprises the steps of:
  (f) measuring at least one critical dimension of said pattern of opaque material after said second etching process and comparing said measured critical dimension to a predetermined value thereby determining the presence of remaining excess opaque material; and
  (g) performing a third etching process by exposing said substantially transparent substrate, said pattern of anti-reflective material, and said remaining excess opaque material to electrified plasma gases for a second period of time, wherein said electrified plasma gases are comprised of chlorine and oxygen, said second period of time corresponding to said portion of said remaining excess opaque material to be removed, said pattern of said anti-reflective material after said third etching process having a third thickness reflecting a third percentage of incident energy less than a predetermined minimum value that an imaging device can accommodate without adversely impacting its operations.

15. The method of claim 14, wherein the ratio of chlorine and oxygen gases is selected such that the relative etch rate of said excess opaque material is increased with respect to the etch rate of said pattern of anti-reflective material.

16. The method of claim 15, wherein the ratio of chlorine to oxygen is 15 percent to 85 percent by volume.

17. The method of claim 9, wherein said opaque material is comprised of chrome and said anti-reflective material is comprised of chrome oxide.

18. The method of claim 9, wherein said opaque material is comprised of molybdenum suicide.

19. The method of claim 13, wherein said process of creating finished photomask further comprises the steps of:
  (f) measuring at least one critical dimension of said pattern of opaque material after said second etching process and comparing said measured critical dimension to a predetermined value thereby determining the presence of remaining excess opaque material; and
  (g) performing a third etching process by exposing said substantially transparent substrate, said pattern of anti-reflective material, and said remaining excess opaque material to electrified plasma gases for a second specified amount of time, said second specified amount of time corresponding to said portion of said remaining excess opaque material to be removed, said pattern of said anti-reflective material after said third etching process having a third reflectivity value less than a predetermined minimum value.

20. The method of claim 19, wherein said electrified plasma gases used in said third etching process are comprised of chlorine and oxygen.

21. The method of claim 20, wherein the ratio of chlorine and oxygen gases used in said third etching process is selected such that the relative etch rate of said remaining excess opaque material is increased with respect to the etch rate of said pattern of anti-reflective material.

22. The method of claim 21, wherein the ratio of chlorine to oxygen is 15 percent to 85 percent by volume.

23. A method of manufacturing a semiconductor comprising the steps of:

interposing a finished photomask, having substantially transparent areas, between a semiconductor wafer and an energy source;

transmitting energy generated by said energy source through said substantially transparent areas of said finished photomask to said semiconductor wafer; and etching an image, corresponding to said substantially transparent areas of said finished photomask, on said semiconductor wafer, wherein an improved photomask is created from an under processed photomask by undergoing a process for improving the yield of photomasks by enabling out of tolerance critical dimensions of opaque material on said under processed photomask to be adjusted within specified limits after resist material has been removed from said under processed photomask, said under processed photomask comprising a substantially transparent substrate and patterned areas of opaque material and anti-reflective material, said anti-reflective material having an initial thickness with a reflectivity value reflecting a first percentage of incident energy, said process for improving the yield of photomasks comprising the steps of:

(a) measuring at least one critical dimension of said patterned areas of opaque material to determine the amount of excess opaque material to be removed; and (b) exposing said under processed photomask to electrified plasma gases for a period of time corresponding to the desired amount of excess opaque material to be removed, said electrified plasma gases reacting with and removing at least a portion of said excess opaque material, said anti-reflective material after said exposure to said electrified plasma gases having a second thickness with a reflectivity value reflecting a second percentage of incident energy less than a predetermined value that an imaging device can accommodate without adversely impacting its operations.

24. The method of claim 23, wherein said step of etching said image comprises the steps of removing photosensitive material from said semiconductor wafer and etching areas of said semiconductor wafer underlying said removed photosensitive material.

25. The method of claim 24, wherein the step of removing photosensitive material comprises removing photosensitive material exposed to said transmitted energy when positive photolithographic processes are used.

26. The method of claim 24, wherein the step of removing photosensitive material comprises removing photosensitive material not exposed to said transmitted energy when negative photolithographic processes are used.

27. The method of claim 23, wherein said under processed photomask is subjected to a series of exposures to electrified plasma gases, each of said exposures removing at least a portion of said excess opaque material, and wherein after each of said exposures at least one critical dimension of the opaque material is measured to determine whether it is within predetermined limits.

28. The method of claim 23, wherein said opaque material is comprised of chrome and said anti-reflective material is comprised of chrome oxide.

29. The method of claim 28, wherein said under processed photomask is exposed to plasma gases comprising chlorine and oxygen.

30. The method of claim 29, wherein the ratio of chlorine and oxygen gases is selected such that the relative etch rate of said opaque material is increased with respect to the etch rate of said anti-reflective material.

31. The method of claim 30, wherein the ratio of chlorine to oxygen is 15 percent to 85 percent by volume.

* * * * *